US011114152B1

(12) United States Patent
Kim et al.

(10) Patent No.: US 11,114,152 B1
(45) Date of Patent: Sep. 7, 2021

(54) SEMICONDUCTOR MEMORY DEVICE INCLUDING PAGE BUFFERS

(71) Applicant: SK hynix Inc., Icheon-si (KR)

(72) Inventors: Dong Hyuk Kim, Icheon-si (KR); Sung Lae Oh, Icheon-si (KR); Yeong Taek Lee, Icheon-si (KR); Tae Sung Park, Icheon-si (KR); Soo Nam Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/010,126

(22) Filed: Sep. 2, 2020

(30) Foreign Application Priority Data

Apr. 22, 2020 (KR) .......................... 10-2020-0048952

(51) Int. Cl.
*G11C 11/40* (2006.01)
*G11C 5/06* (2006.01)
*G11C 11/4093* (2006.01)
*G11C 11/4091* (2006.01)
*G11C 11/4094* (2006.01)

(52) U.S. Cl.
CPC ............ *G11C 11/4093* (2013.01); *G11C 5/06* (2013.01); *G11C 11/4091* (2013.01); *G11C 11/4094* (2013.01)

(58) Field of Classification Search
CPC ... G11C 11/4093; G11C 11/4091; G11C 5/06; G11C 11/4094
See application file for complete search history.

(56) References Cited

U.S. PATENT DOCUMENTS

2017/0236746 A1 * 8/2017 Yu ..................... H01L 27/11582
257/314

FOREIGN PATENT DOCUMENTS

| KR | 10-2000-0045405 A | 7/2000 |
| KR | 10-2010-0051588 A | 5/2010 |

* cited by examiner

*Primary Examiner* — Ajay Ojha

(57) ABSTRACT

A semiconductor memory device includes a memory cell; and a page buffer including a sensing circuit that is coupled to the memory cell through a bit line. The page buffer includes a first transistor included in the sensing circuit; and a second transistor not included in the sensing circuit. A cross-sectional dimension of a first contact which is coupled to the first transistor and a cross-sectional dimension of a second contact which is coupled to the second transistor are different from each other. The cross-sectional dimension of the second contact is smaller than the cross-sectional dimension of the first contact.

20 Claims, 11 Drawing Sheets

SEMICONDUCTOR MEMORY DEVICE INCLUDING PAGE BUFFERS

CROSS-REFERENCE TO RELATED APPLICATION

The present application claims priority under 35 U.S.C. § 119(a) to Korean Patent Application No. 10-2020-0048952 filed in the Korean Intellectual Property Office on Apr. 22, 2020, which is incorporated herein by reference in its entirety.

BACKGROUND

1. Technical Field

Various embodiments generally relate to a semiconductor memory device, and particularly, to a semiconductor memory device including page buffers.

2. Related Art

A volatile memory device has high write and read speeds, but may lose data stored therein if its power supply is interrupted. A nonvolatile memory device has relatively low write and read speeds, but may retain data stored therein even though its power supply is interrupted. Therefore, in order to store data which should be retained regardless of power supply, a nonvolatile memory device is used.

Among nonvolatile memory devices, a NAND flash memory device is widely used as a data storage device. The NAND flash memory device may perform operations necessary to read and output data stored in memory cells by using a plurality of page buffers.

SUMMARY

Various embodiments are directed to measures capable of reducing the size of a page buffer.

In an embodiment, a semiconductor memory device may include: a memory cell; and a page buffer including a sensing circuit that is coupled to the memory cell through a bit line. The page buffer may include: a first transistor included in the sensing circuit; and a second transistor not included in the sensing circuit. A cross-sectional dimension of a first contact coupled to the first transistor and a cross-sectional dimension of a second contact coupled to the second transistor may be different from each other. The cross-sectional dimension of the second contact may be smaller than the cross-sectional dimension of the first contact.

In an embodiment, a semiconductor memory device may include: a memory cell array defined in a memory structure stacked on a logic structure; and a page buffer, defined in the logic structure, that includes a sensing circuit that reads data stored in the memory cell array. The page buffer may include: a first transistor included in the sensing circuit; and a second transistor not included in the sensing circuit. A cross-sectional dimension of a first contact coupled to the first transistor and a cross-sectional dimension of a second contact coupled to the second transistor may be different from each other.

In an embodiment, a semiconductor memory device may include: a memory cell array defined in a cell wafer; and a page buffer, defined in a peripheral wafer bonded onto the cell wafer, that includes a sensing circuit that reads data stored in the memory cell array. The page buffer may include: a first transistor included in the sensing circuit; and a second transistor not included in the sensing circuit. A cross-sectional dimension of a first contact coupled to a junction region of the first transistor and a cross-sectional dimension of a second contact coupled to a junction region of the second transistor may be different from each other.

DETAILED DESCRIPTION

Figure 1:
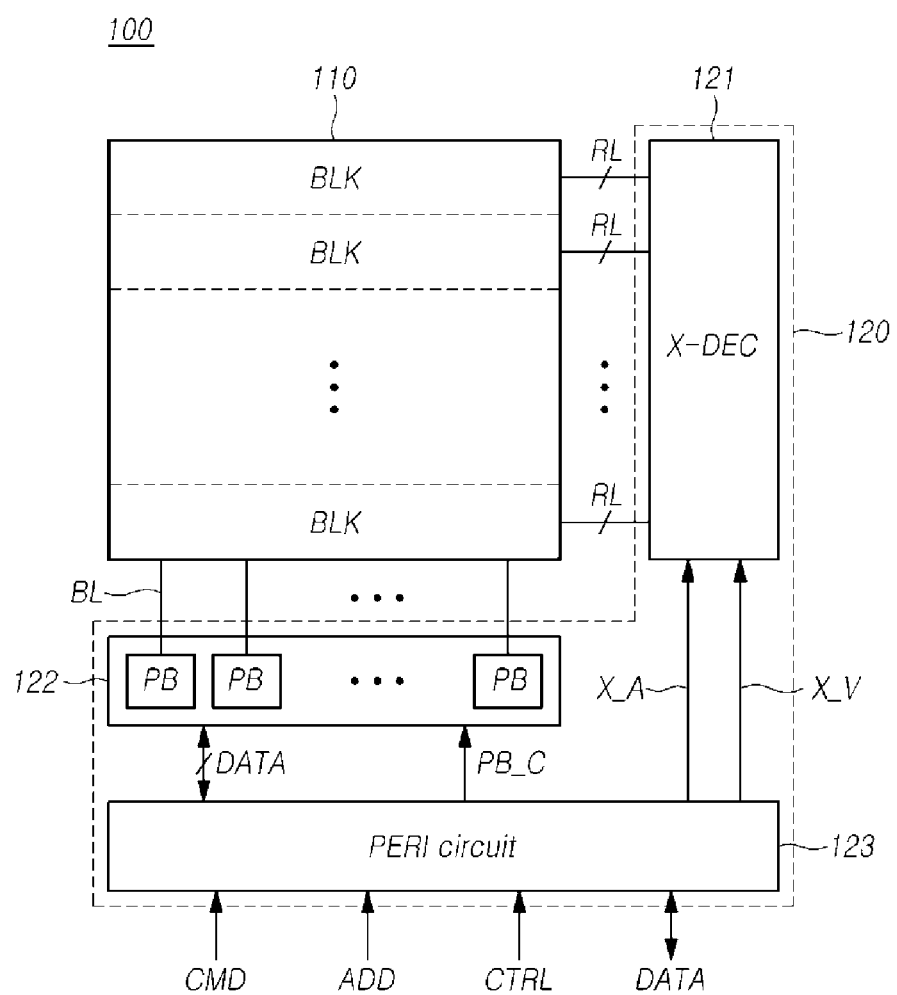
FIG. 1 is a block diagram illustrating a representation of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative, and so the present disclosure is not limited to the illustrated matters. Throughout the specification, like reference numerals refer to like components. In describing the disclosure, when it is determined that a detailed description of the related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article, e.g., "a," "an" or "the," is used when referring to a singular noun, this may include a plural of that noun unless specifically stated otherwise.

Elements in embodiments of the disclosure should be interpreted as including error margins even in the absence of explicit statements.

Also, in describing the components of the disclosure, there is may be used terms such as first, second, A, B, (a), and (b). These are solely for the purpose of differentiating one component from another component and do not limit the substances, order, sequence or number of the components. Also, components in embodiments of the disclosure are not limited by these terms. These terms are used to merely distinguish one component from another component. Accordingly, as used herein, a first component may be a second component within the technical spirit of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram illustrating a representation of a semiconductor memory device in accordance with an embodiment of the disclosure.

Referring to FIG. 1, a semiconductor memory device 100 in accordance with an embodiment of the disclosure may include a memory cell array 110, a row decoder (X-DEC) 121, a page buffer circuit 122 and a peripheral circuit (PERI circuit) 123.

The memory cell array 110 may include a plurality of memory blocks BLK. While not illustrated, each of the memory blocks BLK may include a plurality of memory cells. Each memory cell may be a volatile memory cell or may be a nonvolatile memory cell. While embodiments herein describe a semiconductor memory device that is a vertical NAND flash device, it is to be understood that the technical spirit of the disclosure is not limited thereto.

The memory cell array 110 may be coupled to the row decoder 121 through row lines RL. The row decoder 121 may select any one among the memory blocks BLK included in the memory cell array 110, in response to a row address X_A provided from the peripheral circuit 123. The row decoder 121 may transfer an operating voltage X_V, provided from the peripheral circuit 123, to row lines RL coupled to a memory block BLK that is selected from among the memory blocks BLK included in the memory cell array 110.

The memory cell array 110 may be coupled to the page buffer circuit 122 through bit lines BL. The page buffer circuit 122 may include a plurality of page buffers PB, which are coupled to the bit lines BL, respectively. The page buffer circuit 122 may receive page buffer control signals PB_C from the peripheral circuit 123, and may transmit and receive a data signal DATA to and from the peripheral circuit 123. The page buffer circuit 122 may control a bit line BL, which is arranged in the memory cell array 110, in response to the page buffer control signals PB_C. For example, the page buffer circuit 122 may detect data, stored in a memory cell of the memory cell array 110, by sensing the signal of a bit line BL of the memory cell array 110 in response to the page buffer control signals PB_C, and may transmit the data signal DATA to the peripheral circuit 123 depending on the detected data. The page buffer circuit 122 may apply a signal to a bit line BL based on the data signal DATA received from the peripheral circuit 123 in response to the page buffer control signals PB_C, and thereby, may write data in a memory cell of the memory cell array 110. The page buffer circuit 122 may write or read data in or from a memory cell which is coupled to a word line activated by the row decoder 121.

The peripheral circuit 123 may receive a command signal CMD, an address signal ADD and a control signal CTRL from a device outside the semiconductor memory device 100, such as for example a memory controller, and may transmit and receive data DATA to and from the device outside the semiconductor memory device 100. The peripheral circuit 123 may output signals for writing data in the memory cell array 110 or reading data from the memory cell array 110, for example, the row address X_A, the page buffer control signals PB_C and so forth, based on the command signal CMD, the address signal ADD and the control signal CTRL. The peripheral circuit 123 may generate various voltages including the operating voltage X_V, which are required in the semiconductor memory device 100.

The row decoder 121, the page buffer circuit 122 and the peripheral circuit 123 may configure a logic circuit 120. The logic circuit 120 may be disposed under the memory cell array 110. This structure may be defined as a PUC (peri under cell) structure. The memory cell array 110 and the logic circuit 120 may be fabricated on different wafers, and then, may be bonded and coupled into one. This structure may be defined as a POC (peri over cell) structure. The semiconductor memory device 100, in accordance with an embodiment of the disclosure, may include either a PUC or a POC structure.

Figure 2:
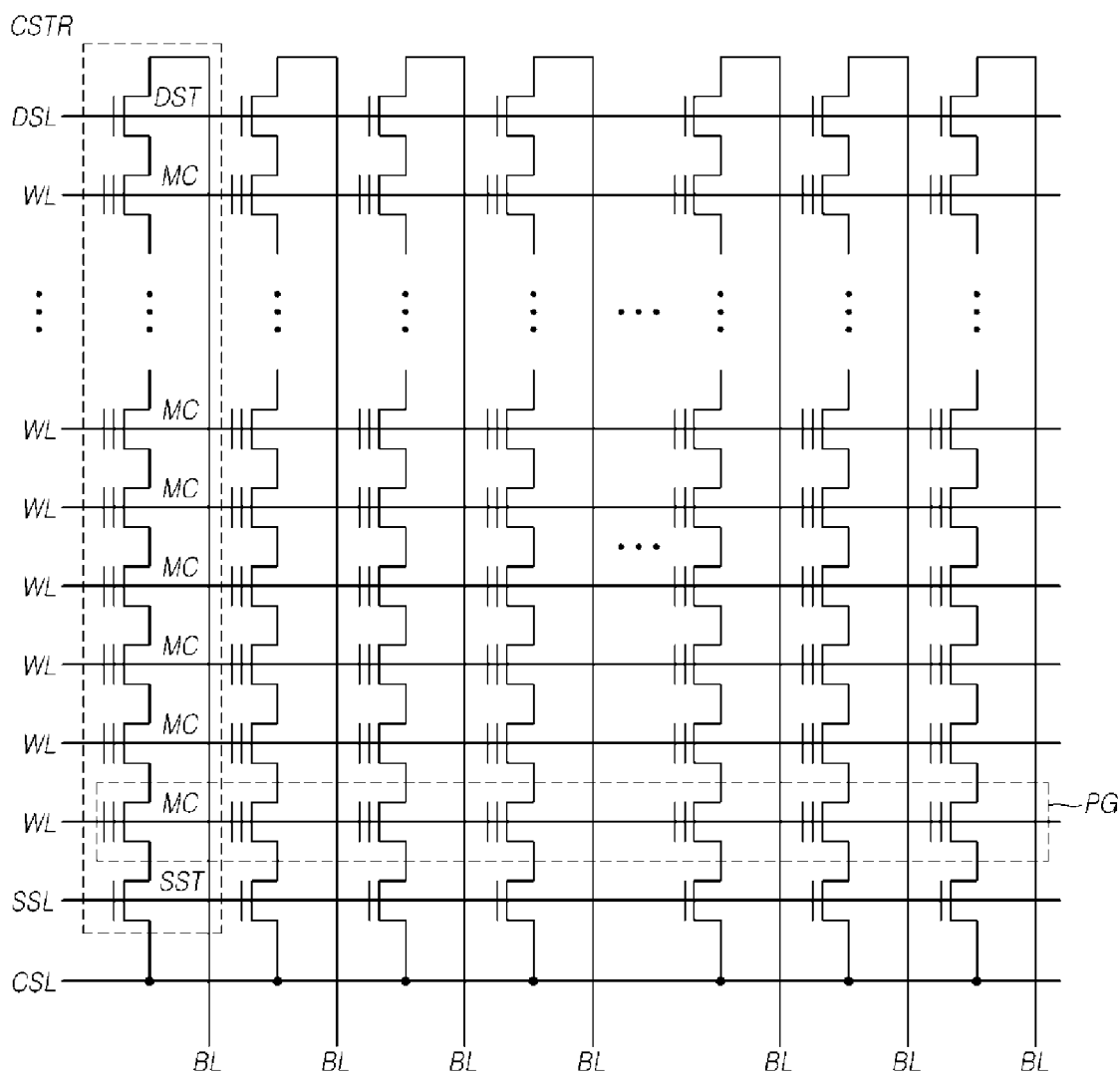
FIG. 2 is an equivalent circuit diagram illustrating a representation of one of memory blocks illustrated in FIG. 1.

FIG. 2 is an equivalent circuit diagram illustrating a representation of one of the memory blocks BLK illustrated in FIG. 1.

Referring to FIG. 2, a memory block BLK may include a plurality of cell strings CSTR corresponding to a plurality of bit lines BL, and a common source line CSL.

Each of the cell strings CSTR may be coupled between a corresponding bit line BL and the common source line CSL. Each of the cell strings CSTR may include a source select transistor SST, which is coupled to the common source line CSL, a drain select transistor DST which is coupled to the bit line BL, and a plurality of memory cells MC, which are coupled between the source select transistor SST and the drain select transistor DST. The gate of the source select transistor SST may be coupled to a corresponding source select line SSL. The gates of the memory cells MC may be coupled to corresponding word lines WL. The gate of the drain select transistor DST may be coupled to a corresponding drain select line DSL. The source select line SSL, the word lines WL and the drain select line DSL may form a three-dimensional structure by being stacked on a surface of a substrate in a vertical direction.

Memory cells MC included in the memory block BLK may be divided into physical page units or logical page units. For example, memory cells MC that share a word line WL and are coupled to different cell strings CSTR may configure one physical page PG. Such a page may be a basic unit of a read operation.

FIG. 2 illustrates that one drain select transistor DST and one source select transistor SST are provided in each of the cell strings CSTR. However, it is to be noted that at least two drain select transistors or at least two source select transistors may be provided in each of the cell strings CSTR.

Figure 3:
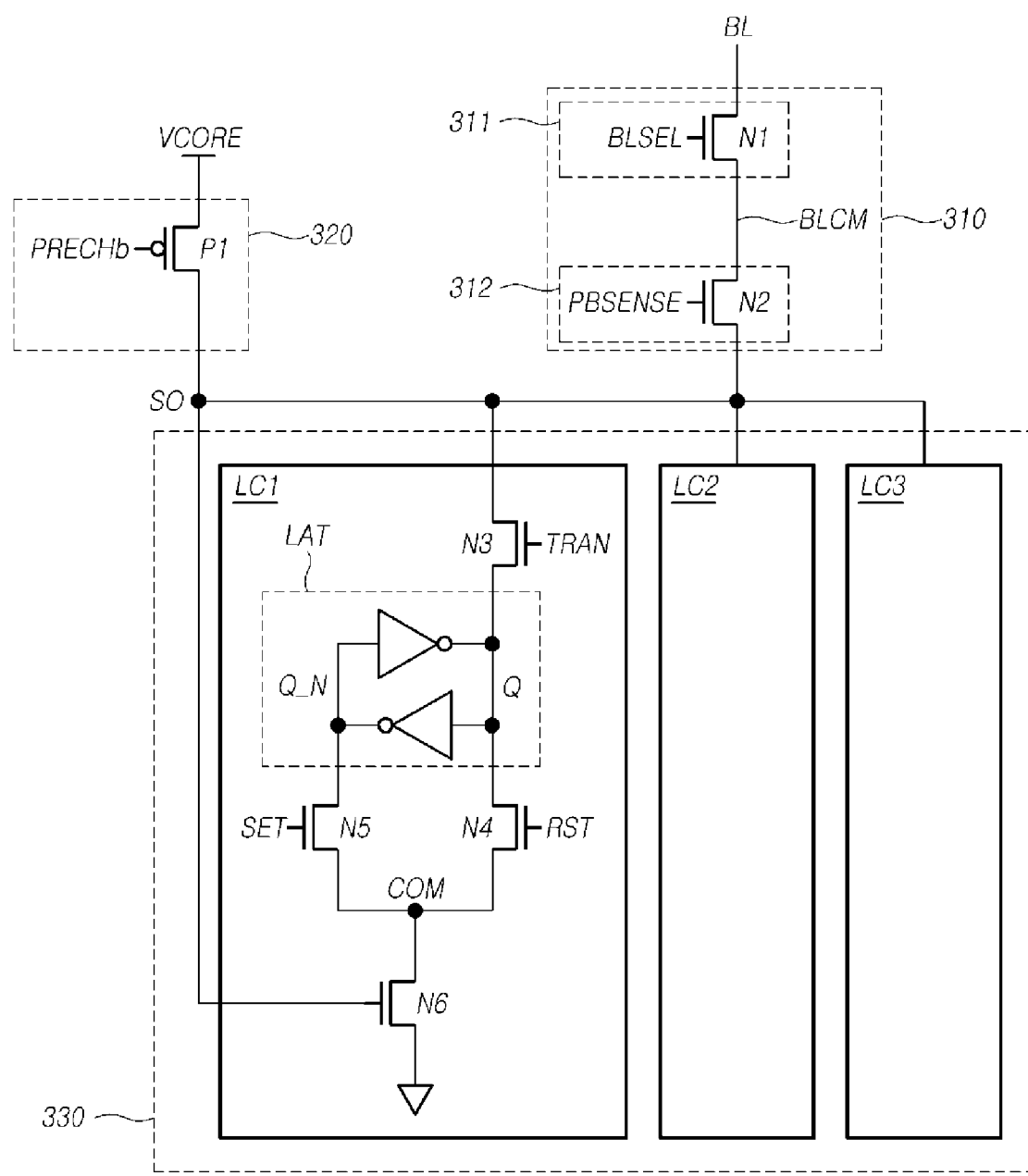
FIG. 3 is a circuit diagram illustrating a representation of a page buffer illustrated in FIG. 1.

FIG. 3 is a circuit diagram illustrating a representation of a page buffer illustrated in FIG. 1.

Referring to FIG. 3, the page buffer may operate in response to page buffer control signals (PB_C of FIG. 1) provided from a peripheral circuit (123 of FIG. 1). The reference symbols BLSEL, PBSENSE, PRECHb, SET, RST and TRAN to be described below may be included in the page buffer control signals.

The page buffer may include a sensing circuit 310, a precharge circuit 320 and a latch circuit 330. The sensing circuit 310 may be coupled between a bit line BL and a sensing node SO, and may perform a read operation on data stored in a memory cell coupled to the bit line BL. In the read operation, the sensing circuit 310 may read the data stored in the memory cell by detecting that a voltage level of the bit line BL has changed depending on a threshold voltage of the memory cell.

The sensing circuit 310 may include a bit line selection section 311 and a bit line sensing section 312. The bit line selection section 311 may couple the bit line BL and a bit line coupling node BLCM in response to a bit line select signal BLSEL. The bit line selection section 311 may include a transistor N1, which is coupled between the bit line BL and the bit line coupling node BLCM and is turned on or off in response to the bit line select signal BLSEL. The bit line sensing section 312 may couple the bit line coupling node BLCM and the sensing node SO in response to a bit line sensing signal PBSENSE. The bit line sensing section 312 may include a transistor N2, which is coupled between the bit line coupling node BLCM and the sensing node SO and is turned on or off in response to the bit line sensing signal PBSENSE.

The precharge circuit 320 may precharge the sensing node SO in response to a precharge signal PRECHb. In a read operation, the precharge circuit 320 may precharge the bit line BL of the memory cell to be read. The precharge circuit 320 may include a transistor P1, which is coupled between a core voltage VCORE and the sensing node SO and is turned on or off in response to the precharge signal PRE-CHb.

The latch circuit 330 may include a plurality of latch sections LC1 to LC3, which are coupled to the sensing node SO. The number of latch sections included in the latch circuit 330 may vary depending on design requirements. FIG. 3 illustrates an embodiment with three latch sections included in the latch circuit 330. Hereinafter, for the sake of convenience in explanation, the latch sections LC1 to LC3 will be defined as first to third latch sections, respectively.

For example, in a program operation, the first latch section LC1 may temporarily store data provided from the peripheral circuit (123 of FIG. 1), and may transfer the stored data to the second latch section LC2. In the read operation, the first latch section LC1 may temporarily store the data read from the memory cell. In the program operation, the second latch section LC2 may apply a program inhibition voltage or a program permission voltage to the bit line BL depending on the data provided from the first latch section LC1. In the read operation, the second latch section LC2 may temporarily store the data stored in the memory cell in response to a voltage of the bit line BL, and may transfer the stored data to the first latch section LC1. In a verify operation performed after the program operation, the third latch section LC3 may store a comparison result value obtained by comparing the threshold voltage of the memory cell and a target voltage, and may provide a comparison result signal corresponding to the comparison result value to the peripheral circuit (123 of FIG. 1).

The first latch section LC1 may include a latch LAT and a plurality of transistors N3 to N6. The latch LAT may store data. The transistor N3 may couple a non-inverting node Q of the latch LAT to the sensing node SO in response to a transmission signal TRAN. The transistor N4 may couple the non-inverting node Q of the latch LAT to a common node COM in response to a reset signal RST, and the transistor N5 may couple an inverting node Q_N of the latch LAT to the common node COM in response to a set signal SET. The transistor N6 may couple the common node COM to a ground terminal depending on the potential of the sensing node SO.

Although not illustrated, the second latch section LC2 and/or the third latch section LC3 may have substantially the same configuration as the first latch section LC1. Different signals may be provided to the first to third latch sections LC1 to LC3. Accordingly, while the first to third latch sections LC1 to LC3 may have the same configuration, only one of the first to third latch sections LC1 to LC3 may be activated, or the first to third latch sections LC1 to LC3 may perform different functions.

The transistors N1 to N6 and P1 included in the page buffer may be grouped into a first group that is included in the sensing circuit 310 and a second group that is not included in the sensing circuit 310. The transistors N1 and N2 may be included in the first group, and the transistors N3 to N6 and P1 may be included in the second group.

The page buffer of FIG. 3 may read data stored in a memory cell by a voltage sensing scheme. For example, in a read operation, it is possible to read data stored in a memory cell by detecting that a voltage level of a bit line has changed depending on a threshold voltage of the memory cell. In other embodiments, a page buffer may read data stored in a memory cell by a current sensing scheme. An example of a page buffer which adopts the current sensing scheme is illustrated in FIG. 4.

Figure 4:
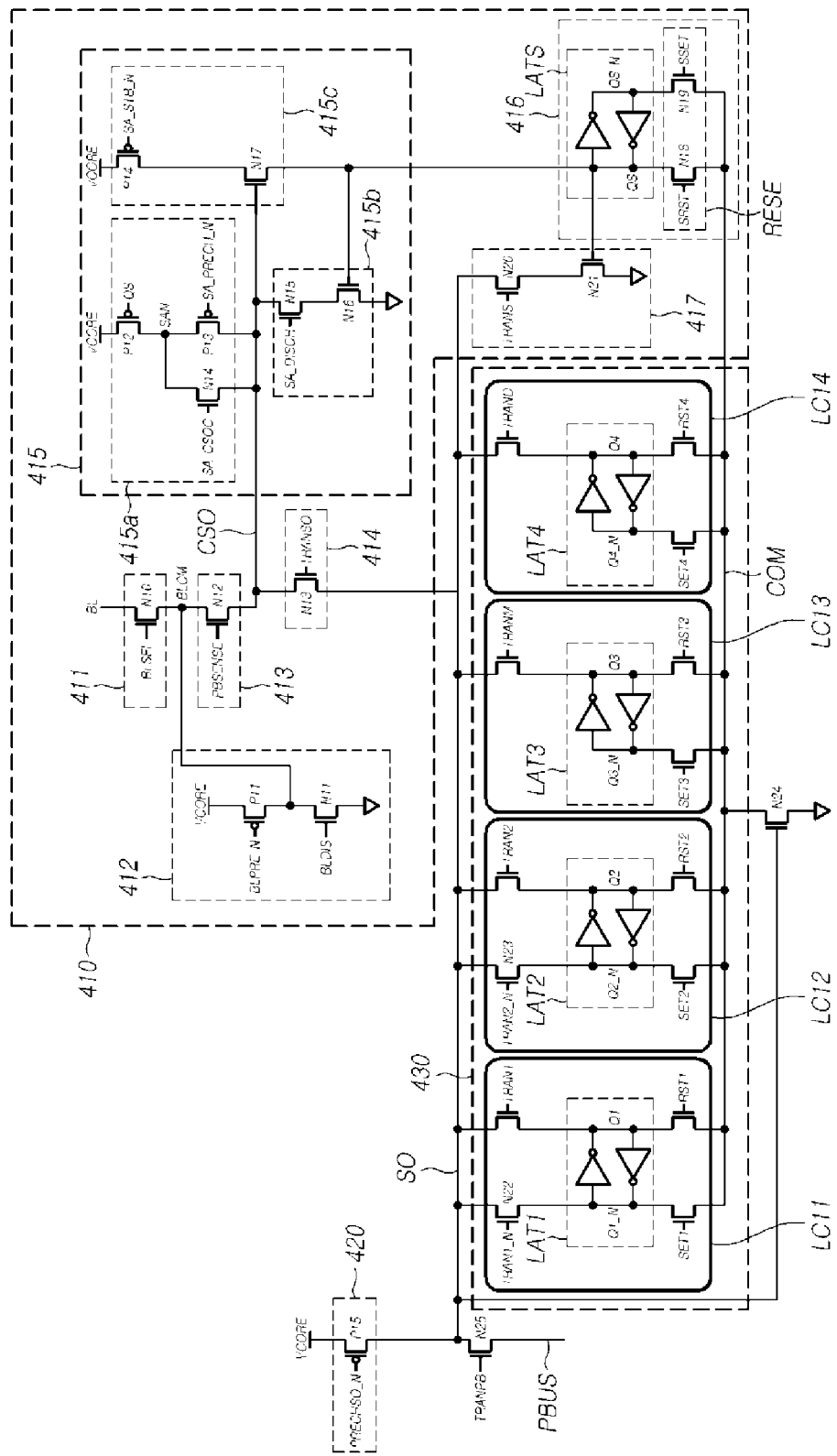
FIG. 4 is a circuit diagram illustrating a representation of a page buffer in accordance with an embodiment of the disclosure.

FIG. 4 is a circuit diagram illustrating a representation of a page buffer in accordance with an embodiment of the disclosure.

Referring to FIG. 4, the page buffer may operate in response to page buffer control signals (PB_C of FIG. 1) provided from a peripheral circuit (123 of FIG. 1). The reference symbols BLSEL, BLPRE_N, BLDIS, PBSENSE, TRANSO, SA_PRECH_N, SA_CSOC, SA_DISCH, SA_S-TB_N, SRST, SSET, TRANS, PRECHSO_N, TRAN1, TRAN1_N, RST1, SET1, TRAN2, TRAN2_N, RST2, SET2, TRANM, RST3, SET3, TRAND, RST4 and SET4 to be described below may be included in the page buffer control signals PB_C.

The page buffer may include a sensing circuit 410, a precharge circuit 420 and a latch circuit 430. The sensing circuit 410 may be coupled to a bit line BL, and may perform a read operation on data stored in a memory cell coupled to the bit line BL. That is to say, in a read operation, it is possible to read the data stored in the memory cell by detecting that a current level of the bit line BL has changed depending on a threshold voltage of the memory cell. The sensing circuit 410 may include a bit line selection section 411, a bit line charge section 412, a bit line sensing section 413, a sensing node coupling section 414, a current control section 415, a sensing latch section 416, and a data transmission section 417.

The bit line selection section 411 may couple the bit line BL and a bit line coupling node BLCM in response to a bit line select signal BLSEL. The bit line selection section 411 may include a transistor N10, which is coupled between the bit line BL and the bit line coupling node BLCM and is turned on or off in response to the bit line select signal BLSEL.

The bit line charge section 412 may precharge the bit line coupling node BLCM in response to a bit line precharge signal BLPRE_N, or may discharge the bit line coupling node BLCM in response to a bit line discharge signal BLDIS. The bit line charge section 412 may include a transistor P11, which is coupled between a core voltage VCORE and the bit line coupling node BLCM and is turned on or off in response to the bit line precharge signal BLPRE_N. The bit line charge section 412 may also include a transistor N11, which is coupled between the bit line coupling node BLCM and a ground terminal and is turned on or off in response to the bit line discharge signal BLDIS.

The bit line sensing section 413 may couple the bit line coupling node BLCM and a current sensing node CSO in response to a bit line sensing signal PBSENSE. The bit line sensing section 413 may include a transistor N12, which is coupled between the bit line coupling node BLCM and the current sensing node CSO and is turned on or off in response to the bit line sensing signal PBSENSE.

The sensing node coupling section 414 may couple the current sensing node CSO and a sensing node SO in response to a node coupling signal TRANSO. The sensing node coupling section 414 may include a transistor N13, which is coupled between the current sensing node CSO and the sensing node SO and is turned on or off in response to the node coupling signal TRANSO.

The current control section 415 may include a reference current generation part 415a, a discharge part 415b, and a current sensing part 415c. The reference current generation part 415a may include a transistor P12, which couples the core voltage VCORE and a sense amplifier node SAN in response to the potential of a first sensing node QS of the sensing latch section 416. The reference current generation part 415a may also include a transistor P13, which couples the sense amplifier node SAN and the current sensing node CSO in response to a reference current precharge signal SA_PRECH_N, and a transistor N14, which couples the sense amplifier node SAN and the current sensing node CSO in response to a sense amplifier coupling signal SA_CSOC.

The discharge part 415b may discharge the current sensing node CSO in response to a sense amplifier discharge signal SA_DISCH and the potential of the first sensing node QS. The discharge part 415b may include a transistor N15 and a transistor N16, which are coupled in series between the current sensing node CSO and a ground terminal. The transistor N15 may couple the current sensing node CSO and the transistor N16 in response to the sense amplifier discharge signal SA_DISCH. The transistor N16 may couple the transistor N15 and the ground terminal in response to the potential of the first sensing node QS.

The current sensing part 415c may couple the core voltage VCORE and the first sensing node QS of the sensing latch section 416 in response to a sense amplifier strobe signal SA_STB_N and the potential of the current sensing node CSO. The current sensing part 415c may include a transistor P14 and a transistor N17, which are coupled in series between the core voltage VCORE and the first sensing node QS. The transistor P14 may couple the core voltage VCORE and the transistor N17 in response to the sense amplifier strobe signal SA_STB_N, and the transistor N17 may couple the transistor P14 and the first sensing node QS in response to the potential of the current sensing node CSO.

The sensing latch section 416 may include a sensing latch LATS and a sensing latch reset/setup part RESE.

The sensing latch LATS may store read data. The sensing latch reset/setup part RESE may be coupled to the first sensing node QS and a second sensing node QS_N of the sensing latch LATS, and may reset or set up the sensing latch LATS. For example, the sensing latch reset/setup part RESE may include a transistor N18, which couples the first sensing node QS of the sensing latch LATS and a common node COM in response to a sensing reset signal SRST, and a transistor N19, which couples the second sensing node QS_N of the sensing latch LATS and the common node COM in response to a sensing setup signal SSET.

The data transmission section 417 may be coupled between the sensing latch LATS and the sensing node SO, and may change the potential of the sensing node SO in response to a sensing data transmission signal TRANS and the potential of the first sensing node QS. For example, the data transmission section 417 may include a transistor N20 and a transistor N21, which are coupled in series between the sensing node SO and a ground terminal. The transistor N20 may couple the sensing node SO and the transistor N21 in response to the sensing data transmission signal TRANS, and the transistor N21 may couple the transistor N20 and the ground terminal in respond to the potential of the first sensing node QS. The precharge circuit 420 may precharge the sensing node SO in response to a precharge signal PRECHSO_N. In a read operation, the precharge circuit 420 may precharge the bit line BL of the memory cell to be read. The precharge circuit 420 may include a transistor P15, which is coupled between a core voltage VCORE and the sensing node SO and is turned on or off in response to the precharge signal PRECHSO_N.

The latch circuit 430 may include a plurality of latch sections LC11 to LC14, which are coupled to the sensing node SO. The number of latch sections included in the latch circuit 430 may vary depending on design requirements. FIG. 4 illustrates an embodiment with four latch sections included in the latch circuit 430. Hereinafter, for the sake of convenience in explanation, the latch sections LC11 to LC14 will be defined as first to fourth latch sections, respectively.

The third and fourth latch sections LC13 and LC14 may have substantially the same configuration as the latch sections described above with reference to FIG. 3. Thus, repeated descriptions for the same configuration will be omitted herein. When compared to the third and fourth latch sections LC13 and LC14, the first latch section LC11 may further include a transistor N22, which couples an inverting node Q1_N of a latch LAT1 to the sensing node SO in response to an inverted transmission signal TRAN1_N. Similar to the first latch section LC11, the second latch section LC12 may further include a transistor N23, which couples an inverting node Q2_N of a latch LAT2 to the sensing node SO in response to an inverted transmission signal TRAN2_N.

Different signals may be provided to the first to fourth latch sections LC11 to LC14. Accordingly, only one of the first to fourth latch sections LC11 to LC14 may be activated, or the first to fourth latch sections LC11 to LC14 may perform different functions. A transistor N24 may be coupled between the common node COM, which is coupled in common to the first to fourth latch sections LC11 to LC14, and a ground terminal. The transistor N24 may discharge the common node COM in response to the potential of the sensing node SO.

A transistor N25 may be coupled between the sensing node SO and a page bus node PBUS. The transistor N25 may couple the sensing node SO and the page bus node PBUS in response to a page data transmission signal TRANPB.

A read operation of the page buffer illustrated in FIG. 4 will be described below. The first sensing node QS of the sensing latch LATS is set to a low level, and a current flowing through the bit line BL is a first reference current. For example, if the first sensing node QS of the sensing latch LATS is set to a low level, and if the transistor P12 of the reference current generation part 415a is turned on, then a current flows through the sense amplifier node SAN. Next, if the transistor N10 and the transistor N12 are turned on as the bit line select signal BLSEL and the bit line sensing signal PBSENSE rise to high levels, and if the transistor P13 is turned on as the reference current precharge signal SA_P-RECH_N falls to a low level, then the first reference current flows through the current sensing node CSO and the bit line BL, and accordingly, the bit line BL is precharged as the potential of the bit line BL increases.

If a read voltage or a verify voltage is applied to a selected word line that is coupled to a selected memory cell, then a current flowing through the bit line BL may vary depending on a state of the memory cell. For example, if a threshold voltage of the selected memory cell is lower than the read voltage or the verify voltage, then a channel is formed in the memory cell. Accordingly, the potential of the bit line BL decreases and a current increases. If a threshold voltage of the selected memory cell is higher than the read voltage or the verify voltage, then a channel is not formed in the memory cell. Accordingly, the potential of the bit line BL is maintained, and due to this fact, a current decreases. As such, a current flowing through the bit line BL may become higher than the first reference current or become lower than the first reference current depending on a state of the selected memory cell. The current flowing through the bit line BL is reflected on the current sensing node CSO, and the transistor N17 may be turned on or off depending on a voltage level corresponding to the current of the current sensing node CSO. For example, if the current flowing through the current sensing node CSO becomes higher than the first reference current, then the transistor N17 may be turned on, and if the current flowing through the current sensing node CSO is maintained at or becomes lower than the first reference current, then the transistor N17 may be turned off. At this time, if the sense amplifier strobe signal SA_STB_N falls to a low level and thus the transistor P14 is turned on, then the data of the first sensing node QS of the sensing latch LATS may be changed or be maintained in a previous state depending on the turn-on or turn-off state of the transistor N17.

The transistors N10 to N25 and P11 to P15 included in the page buffer may be grouped into a first group that is included in the sensing circuit 410 and a second group that is not included in the sensing circuit 410. The transistors N10 to N21 and P11 to P14 may be included in the first group, and the transistors N22 to N25 and P15 may be included in the second group. The page buffers described above with reference to FIGS. 3 and 4 are exemplary, and it should be understood that the structure of a page buffer of the disclosure is not limited thereto.

Figure 5:
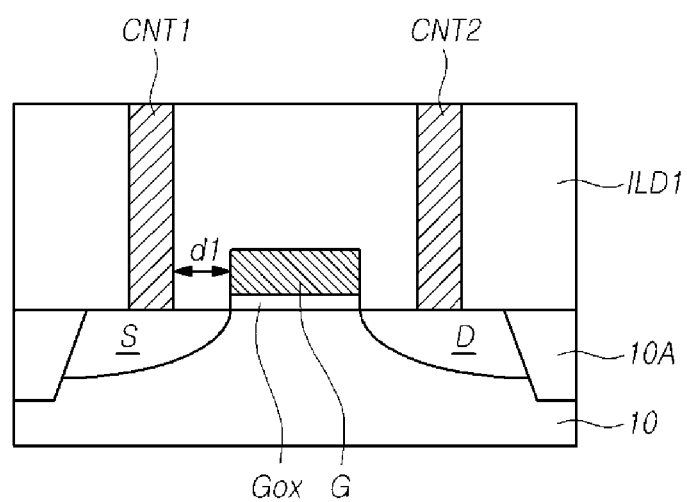
FIG. 5 is a schematic cross-sectional view illustrating a representation of a transistor configuring a page buffer.

FIG. 5 is a schematic cross-sectional view illustrating a representation of a transistor configuring a page buffer.

Referring to FIG. 5, a gate electrode G may be defined over a substrate 10 with a gate dielectric layer Gox interposed therebetween, and junction regions S and D may be defined in an active region of the substrate 10 on both sides of the gate electrode G. The junction regions S and D may include a source region S and a drain region D. The gate dielectric layer Gox, the gate electrode G, the source region S and the drain region D may configure a transistor. A dielectric layer ILD1, which covers the transistor, may be defined on the substrate 10, and contacts CNT1 and CNT2, which are coupled to the source region S and the drain region D respectively, may be defined through the dielectric layer ILD1. The reference numeral 10A denotes an isolation layer for defining the active region.

The transistor may include a conductive path that extends from the contact CNT1 to the source region S, from the source region S to the drain region D through a channel region in the substrate 10, and from the drain region D to the contact CNT2. The driving performance of the transistor may vary depending on the characteristics of the conductive path described above. For example, excellent driving performance may be achieved by generating a strain in the channel region, increasing a dopant profile of the source region S and the drain region D, or lowering a contact resistance.

In order to achieve low contact resistance, a method of increasing the cross-sectional dimension of the contacts CNT1 and CNT2 coupled respectively to the source region S and the drain region D may be employed. If the cross-sectional dimension of the contacts CNT1 and CNT2 is increased while maintaining a size or area of the transistor, a distance d1 between the contacts CNT1 and CNT2 and the gate electrode G decreases, and thus the fringe capacitance of the gate electrode G due to the contacts CNT1 and CNT2 increases. This effect may exert an adverse influence on the driving performance of the transistor. In order to prevent an increase in fringe capacitance due to an increase in the cross-sectional dimension of a contact, which may result in degradation in the driving performance of a transistor, a size or area of the transistor should be increased.

As described above with reference to FIGS. 3 and 4, a page buffer includes a plurality of transistors. If the cross-sectional dimensions of contacts coupled to the transistors included in the page buffer increase, and if the sizes of the transistors are also increased, then the driving performance of the transistors may be improved. However, as the size of the page buffer increases, the degree of integration may decrease. On the other hand, if the cross-sectional dimensions of the contacts coupled to the transistors in the page buffer decrease, and if the sizes of the transistors are also reduced, then an area occupied by the page buffer decreases, and thus, the degree of integration may be increased. In either example, however, the driving performance of the transistors may be degraded, and the performance of the page buffer may suffer. The following embodiments suggest measures capable of reducing the size of a page buffer while maintaining the performance of the page buffer.

Figure 6:
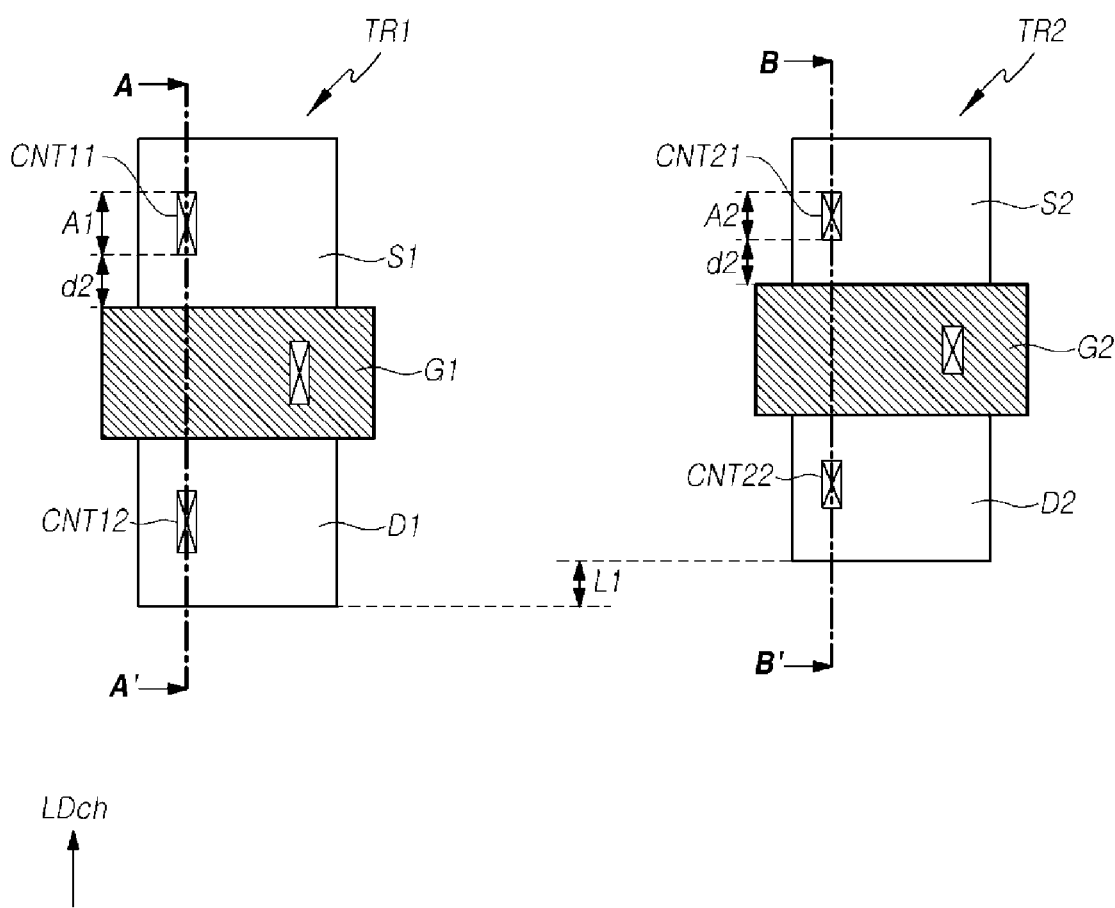
FIG. 6 is a top view illustrating a representation of transistors configuring a page buffer in accordance with an embodiment of the disclosure.

FIG. 6 is a top view illustrating a representation of transistors included in a page buffer in accordance with an embodiment of the disclosure.

Referring to FIG. 6, a page buffer may include a first transistor TR1 and a second transistor TR2. The first transistor TR1 may be a transistor that is included in a sensing circuit (310 of FIG. 3 and 410 of FIG. 4) from among transistors configuring the page buffer. The second transistor TR2 may be a transistor that is not included in the sensing circuit from among the transistors configuring the page buffer.

First contacts CNT11 and CNT12 may be coupled to a source region S1 and a drain region D1 of the first transistor TR1, respectively. Second contacts CNT21 and CNT22 may be coupled to a source region S2 and a drain region D2 of the second transistor TR2, respectively. The first contacts CNT11 and CNT12 may be disposed substantially in a straight line in a transistor channel length direction indicated by the reference symbol LDch. The second contacts CNT21 and CNT22 may also be disposed substantially in a straight line in the transistor channel length direction LDch.

In a read operation, the sensing circuit of the page buffer may read data stored in a memory cell by detecting a changed voltage level of a bit line or a current level of the bit line depending on a threshold voltage of the memory cell. Therefore, in order to read the data stored in the memory cell without an error, it is necessary to keep a high level of driving performance in the first transistor TR1 configuring the sensing circuit. On the other hand, because the second transistor TR2 is not directly involved in a data read operation, a relatively low level of driving performance may be sufficient.

A cross-sectional dimension of the first contacts CNT11 and CNT12, which are coupled to the first transistor TR1, and a cross-sectional dimension of the second contacts CNT21 and CNT22, which are coupled to the second transistor TR2, may be different from each other. For example, the cross-sectional dimension of the first contacts CNT11 and CNT12 may be selected to obtain a required low contact resistance. In comparison, the cross-sectional dimension of the second contacts CNT21 and CNT22 may be smaller than the cross-sectional dimension of the first contacts CNT11 and CNT12.

The cross-sectional dimensions of the contacts CNT11, CNT12, CNT21 and CNT22 may be defined as cross-sectional areas of the contacts CNT11, CNT12, CNT21 and CNT22 at any height. The length of each of the first contacts CNT11 and CNT12 in the channel length direction LDch may have a first size A1. The length of each of the second contacts CNT21 and CNT22 in the channel length direction LDch may have a second size A2 that is smaller than the first size A1. The second size A2 may be reduced within a limit that is set by the manufacturing process technology involved in forming the second contacts CNT21 and CNT22.

A distance between a gate electrode G1 of the first transistor TR1 and the first contact CNT11 or CNT12 may be selected to obtain a required low fringe capacitance. A distance between a gate electrode G2 of the second transistor TR2 and the second contact CNT21 or CNT22 may also be selected to obtain a required low fringe capacitance. For instance, the distance between the gate electrode G1 of the first transistor TR1 and the first contact CNT11 or CNT12 in the channel length direction LDch, and the distance between the gate electrode G2 of the second transistor TR2 and the second contact CNT21 or CNT22 in the channel length direction LDch, may be the same distance d2.

A length of the second transistor TR2 in the channel length direction LDch may have a value smaller by L1 than a length of the first transistor TR1 in the channel length direction LDch. For example, L1 may correspond to a difference between (i) the sum of lengths of the first contacts CNT11 and CNT12 in the channel length direction LDch and (ii) the sum of lengths of the second contacts CNT21 and CNT22 in the channel length direction LDch. That is to say, L1 may be a value corresponding to two times the difference between A1 and A2.

Figure 7:
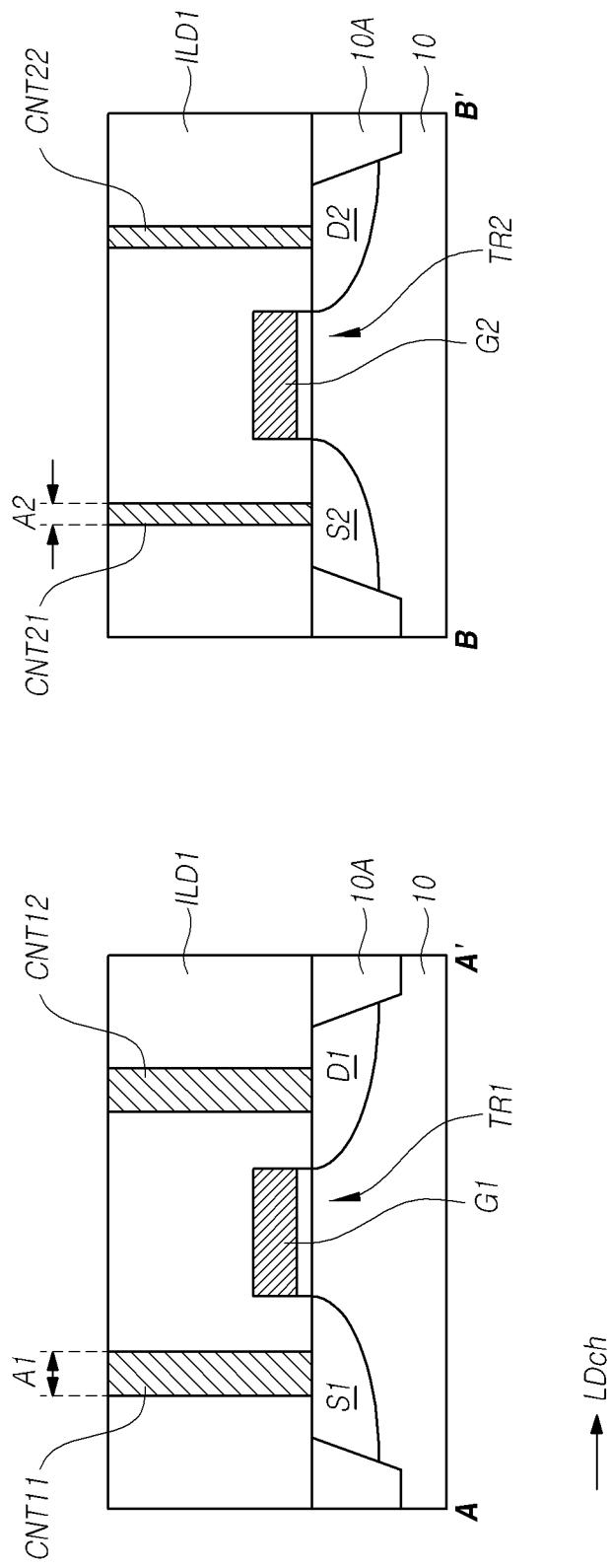
FIG. 7 is a cross-sectional view taken along the lines A-A' and B-B' of FIG. 6.

FIG. 7 is a cross-sectional view taken along the lines A-A' and B-B' of FIG. 6.

Referring to FIG. 7, the first transistor TR1 and the second transistor TR2 may be implemented through substantially the same process technologies. As described above with reference to FIG. 6, the length of the second transistor TR2 in the channel length direction LDch may have a value smaller by L1 than the length of the first transistor TR1 in the channel length direction LDch. In order to implement the required asymmetric transistors TR1 and TR2, either a process for forming an isolation layer 10A delimiting active regions in which the transistors TR1 and TR2 are disposed, or a process for forming source regions S1 and S2 and drain regions D1 and D2 of the transistors TR1 and TR2, may be changed.

For example, in order to ensure that a length of the first transistor TR1 in the channel length direction LDch and a length of the second transistor TR2 in the channel length direction LDch have different target values, the shape of a mask pattern used to define the isolation layer 10A delimiting the active regions in which the transistors TR1 and TR2 are disposed may be changed. In another example, the shape of a mask pattern used in an ion implantation process for forming the source regions S1 and S2 and the drain regions D1 and D2 of the transistors TR1 and TR2 may be changed.

A dielectric layer ILD1, which covers the first and second transistors TR1 and TR2, may be defined on a substrate 10, and a plurality of contact holes that expose the source region S1 and the drain region D1 of the first transistor TR1 and that expose the source region S2 and the drain region D2 of the second transistor TR2 may be formed in the dielectric layer ILD1 through a hole etching process. Thereafter, as a conductive material is filled in the contact holes, the first contacts CNT11 and CNT12 and the second contacts CNT21 and CNT22 may be configured.

The length of each of the first contacts CNT11 and CNT12 in the channel length direction LDch may have a first size A1, and the length of each of the second contacts CNT21 and CNT22 in the channel length direction LDch may have a second size A2, which is smaller than the first size A1. In order to obtain the required differences in cross-sectional dimensions between the first contacts CNT11 and CNT12 on one hand and the second contacts CNT21 and CNT22 on the other hand, the hole etching process may be changed. For example, in order to ensure that the cross-sectional dimension of the first contacts CNT11 and CNT12 and the cross-sectional dimension of the second contacts CNT21 and CNT22 have different target values, a mask pattern having openings of different sizes in the region of the first transistor TR1 and the region of the second transistor TR2 may be provided. In another example, a separate mask pattern may be provided for each of the first transistor TR1 and the second transistor TR2 during the hole etching process. The asymmetry of a contact structure may be achieved only by changing a target size of a contact in a conventional design.

Figure 8:
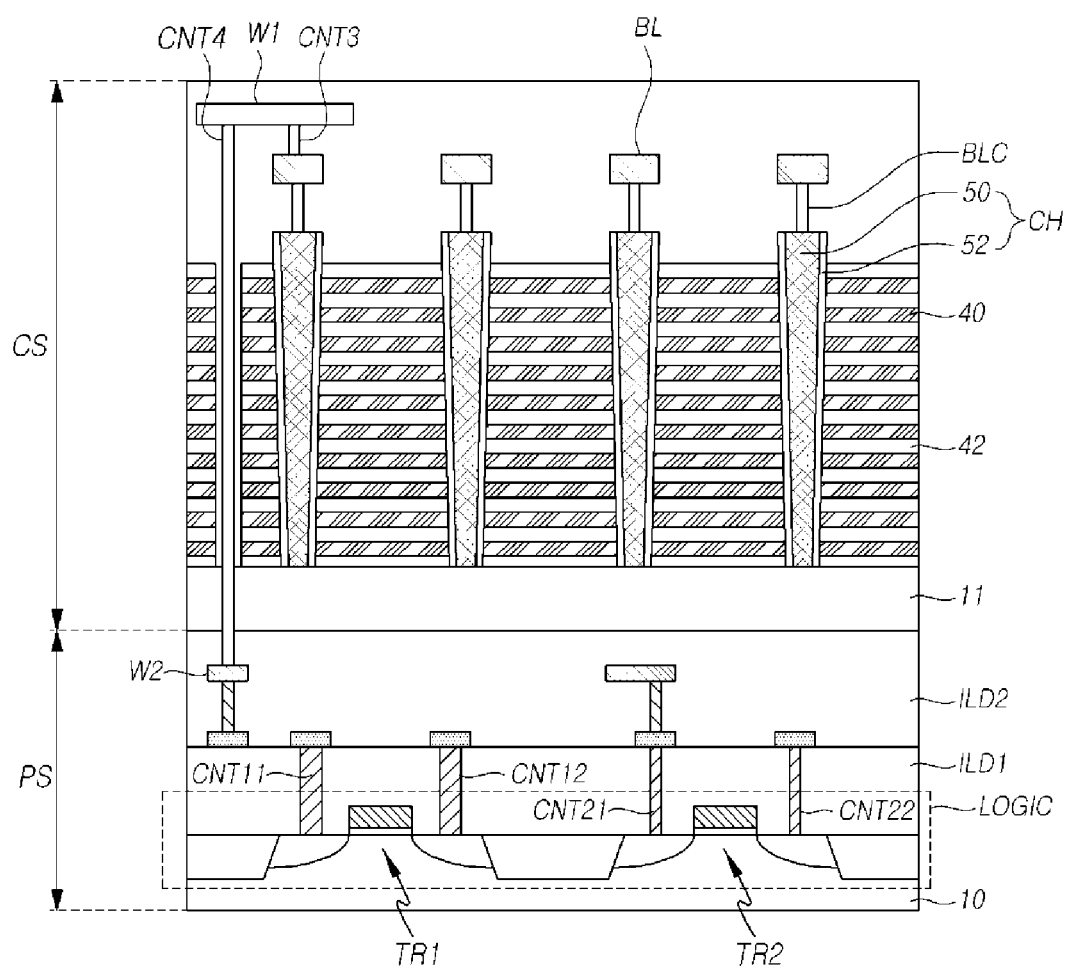
FIG. 8 is a cross-sectional view illustrating a representation of a semiconductor memory device in accordance with an embodiment of the disclosure.

FIG. 8 is a cross-sectional view illustrating a representation of a semiconductor memory device in accordance with an embodiment of the disclosure.

Referring to FIG. 8, the semiconductor memory device may have a PUC (peri under cell) structure. A logic structure PS may be disposed under a memory structure CS.

The logic structure PS may include a first substrate 10 and a logic circuit LOGIC that is defined on the first substrate 10. The first substrate 10 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The logic circuit LOGIC may include a first transistor TR1 and a second transistor TR2 described above with reference to FIGS. 6 and 7. A dielectric layer ILD1 may be defined on the first substrate 10 to cover the first and second transistors TR1 and TR2. First contacts CNT11 and CNT12 coupled to the first transistor TR1, and second contacts CNT21 and CNT22 coupled to the second transistor TR2, may be defined through the dielectric layer ILD1. A dielectric layer ILD2 may be defined on the dielectric layer ILD1 to cover the first contacts CNT11 and CNT12 and the second contacts CNT21 and CNT22.

The memory structure CS may include a second substrate 11 that is defined on the logic structure PS, a plurality of electrode layers 40 and a plurality of interlayer dielectric layers 42, which are alternately stacked on the second substrate 11, and a plurality of vertical channels CH that pass through the plurality of electrode layers 40 and the plurality of interlayer dielectric layers 42.

The electrode layers 40 may include a conductive material. For example, the electrode layers 40 may include at least one selected among a doped semiconductor (e.g., doped silicon), a metal (e.g., tungsten, copper or aluminum), conductive metal nitride (e.g., titanium nitride or tantalum nitride) and a transition metal (e.g., titanium or tantalum). The interlayer dielectric layers 42 may include silicon oxide. Among the electrode layers 40, at least one electrode layer 40 from the lowermost electrode layer 40 may configure a source select line, and at least one electrode layer 40 from the uppermost electrode layer 40 may configure a drain select line. The electrode layers 40 between the source select line and the drain select line may configure word lines.

Each of the vertical channels CH may include a channel layer 50 and a gate dielectric layer 52. The channel layer 50 may include polysilicon or monocrystalline silicon, and may include a P-type impurity such as boron (B) in some regions thereof. The gate dielectric layer 52 may include a tunnel dielectric layer, a charge storage layer and a blocking layer, which are sequentially stacked from the outer sidewall of the channel layer 50. In some embodiments, the gate dielectric layer 52 may have an ONO (oxide-nitride-oxide) stack structure in which an oxide layer, a nitride layer and an oxide layer are sequentially stacked. Source select transistors, memory cells and drain select transistors may be configured in areas or regions in which the electrode layers 40 surround the vertical channels CH.

Bit lines BL may be defined over the electrode layers 40 and the interlayer dielectric layers 42, which are alternately stacked. Bit line contacts BLC may be defined under the bit lines BL to couple the vertical channels CH and the bit lines BL.

FIG. 8 illustrates a structure in which the bit line BL defined in the memory structure CS is coupled to the logic structure PS. A wiring line W1 may be disposed over the bit lines BL. A contact CNT3 may be defined under the wiring line W1 to couple the wiring line W1 and the bit line BL. The wiring line W1 may be coupled to a wiring line W2 of the logic structure PS through a contact CNT4. Although not illustrated, the wiring line W2 may be coupled to the logic circuit LOGIC. Consequently, an electrical path is configured to couple the bit lines BL and the logic circuit LOGIC.

Figure 9:
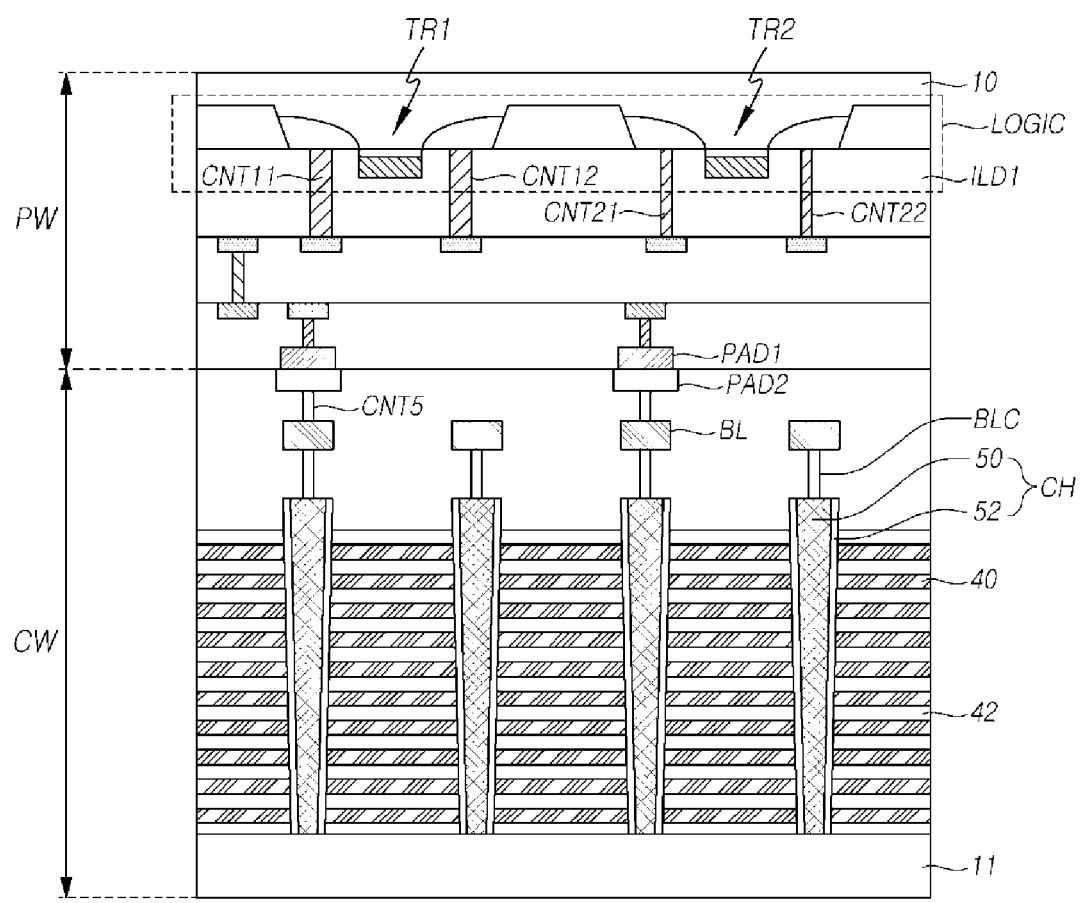
FIG. 9 is a cross-sectional view illustrating a representation of a semiconductor memory device in accordance with another embodiment of the disclosure.

FIG. 9 is a cross-sectional view illustrating a representation of a semiconductor memory device in accordance with another embodiment of the disclosure.

Referring to FIG. 9, a semiconductor memory device may have a POC (peri over cell) structure. A peripheral wafer PW including a logic circuit LOGIC may be bonded onto a cell wafer CW including a memory cell array.

The peripheral wafer PW and the cell wafer CW may be individually fabricated, and then bonded to each other to be coupled into one. The logic circuit LOGIC may include a first transistor TR1 and a second transistor TR2 described above with reference to FIGS. 6 and 7. A dielectric layer ILD1 may be defined on a first substrate 10 to cover the first and second transistors TR1 and TR2. First contacts CNT11 and CNT12 coupled to the first transistor TR1 and second contacts CNT21 and CNT22 coupled to the second transistor TR2 may be defined through the dielectric layer ILD1.

The memory cell array may be fabricated on a second substrate 11 of the cell wafer CW. The first substrate 10 and the second substrate 11 may be made of the same material. Each of the first substrate 10 and the second substrate 11 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

First pads PAD1 may be defined on one surface of the peripheral wafer PW. Although not illustrated in detail, the first pads PAD1 may be electrically coupled to the logic circuit LOGIC. Second pads PAD2 may be defined on one surface of the cell wafer CW. Each of the second pads PAD2 may be coupled to one of bit lines BL through a contact CNT5.

The one surface of the peripheral wafer PW and the one surface of the cell wafer CW may be bonded to each other such that the first pads PAD1 defined on the one surface of the peripheral wafer PW and the second pads PAD2 defined on the one surface of the cell wafer CW are bonded to each other. Accordingly, electrical paths that couple the memory cell array of the cell wafer CW and the logic circuit LOGIC of the peripheral wafer PW may be configured.

As is apparent from the above descriptions, according to embodiments of the disclosure, a cross-sectional dimension of first contacts coupled to a first transistor included in a sensing circuit, among transistors configuring a page buffer, may be configured such that the driving performance of the first transistor is kept high, that is, the resistance of the first contacts is kept low. On the other hand, a cross-sectional dimension of second contacts coupled to a second transistor not included in the sensing circuit, among the transistors configuring the page buffer, may be configured to have a size smaller than the cross-sectional dimension of the first contacts. Accordingly, it is possible to make the size of the second transistor smaller than the size of the first transistor.

In other words, by dividing the transistors included in the page buffer into transistors that are involved in a data read operation of the page buffer and transistors that are not directly involved in the data read operation, and by adapting the sizes of the contacts coupled to the respective transistors, it is possible to reduce the sizes of some transistors configuring the page buffer, while maintaining the data sensing capability of the page buffer. As a result, it is possible to reduce an area occupied by the page buffer while maintaining the performance of the page buffer, thereby contributing to an improved integration of a semiconductor memory device.

Figure 10:
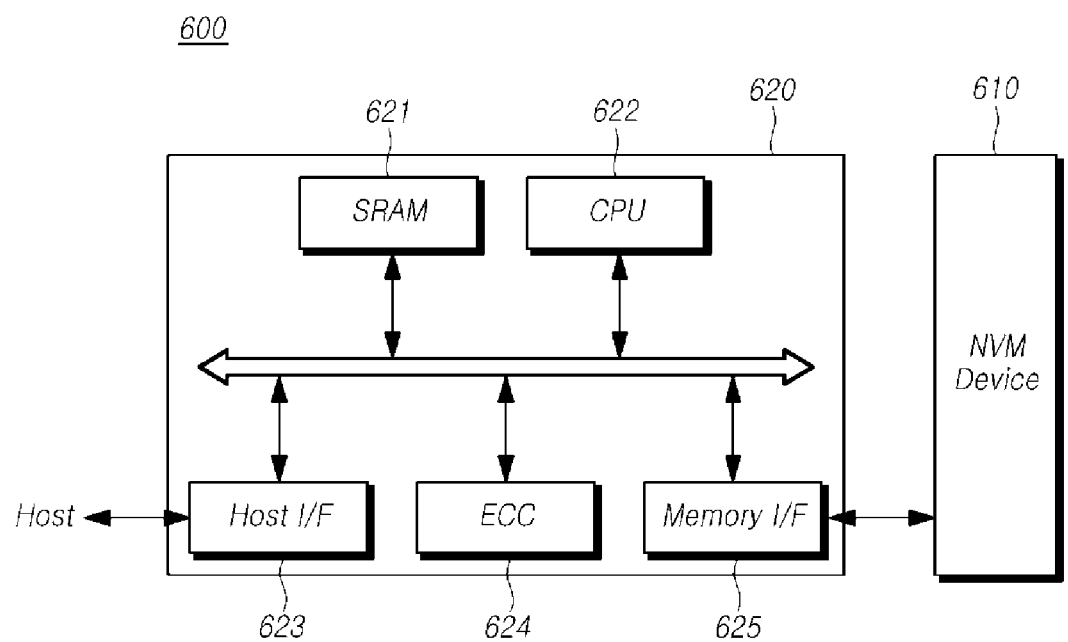
FIG. 10 is a block diagram schematically illustrating a memory system including a semiconductor memory device in accordance with an embodiment of the disclosure.

FIG. 10 is a block diagram schematically illustrating a memory system including a semiconductor memory device in accordance with an embodiment of the disclosure.

Referring to FIG. 10, a memory system 600 in accordance with an embodiment may include a nonvolatile memory device (NVM Device) 610 and a memory controller 620.

The nonvolatile memory device 610 may be constituted by a semiconductor memory device described above and may operate in the manner described above. The memory controller 620 may be configured to control the nonvolatile memory device (NVM Device) 610. The combination of the nonvolatile memory device 610 and the memory controller 620 may be configured as a memory card or a solid state disk (SSD) may be provided. An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device (NVM Device) 610.

A memory interface (MEMORY I/F) 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Drive Electronics) protocol.

Figure 11:
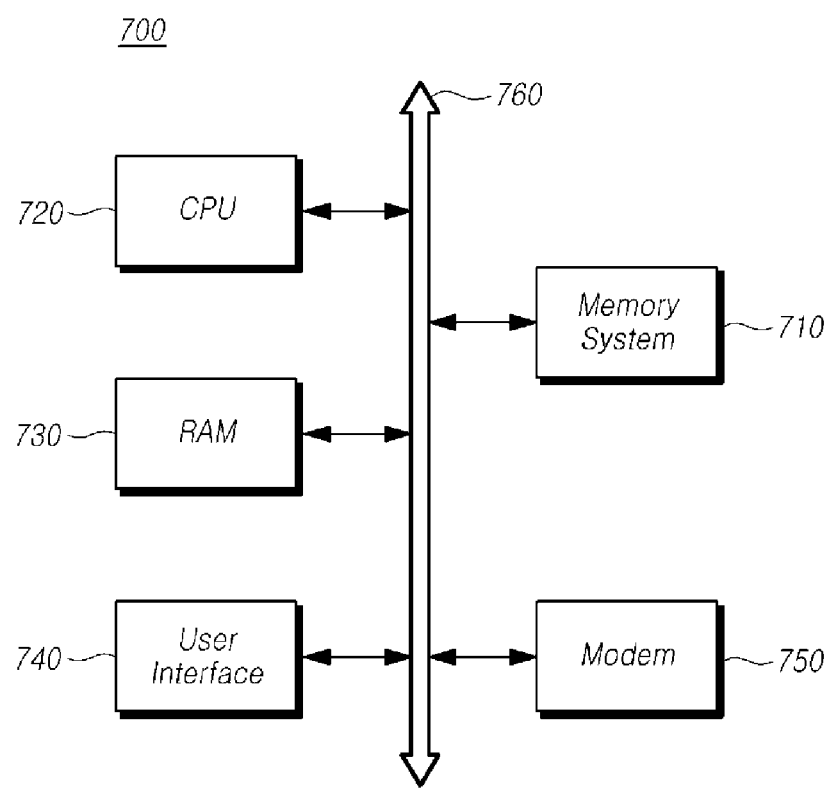
FIG. 11 is a block diagram schematically illustrating a computing system including a semiconductor memory device in accordance with an embodiment of the disclosure.

FIG. 11 is a block diagram schematically illustrating a computing system including a semiconductor memory device in accordance with an embodiment of the disclosure.

Referring to FIG. 11, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
   a memory cell; and
   a page buffer including a sensing circuit that is coupled to the memory cell through a bit line,
   the page buffer comprising:
   a first transistor included in the sensing circuit; and
   a second transistor not included in the sensing circuit,
   wherein a cross-sectional dimension of a first contact coupled to the first transistor and a cross-sectional dimension of a second contact coupled to the second transistor are different from each other.

2. The semiconductor memory device according to claim 1, wherein the cross-sectional dimension of the second contact is smaller than the cross-sectional dimension of the first contact.

3. The semiconductor memory device according to claim 1, wherein the first contact is coupled to a junction region of the first transistor, and the second contact is coupled to a junction region of the second transistor.

4. The semiconductor memory device according to claim 1,
   wherein the first and second transistors are disposed on a single substrate, and
   wherein the first and second contacts pass through a dielectric layer that isolates the substrate and a wiring layer over the substrate and that covers the first and second transistors.

5. The semiconductor memory device according to claim 1, wherein a channel length direction of the first transistor and a channel length direction of the second transistor is the same, and a length of the second contact is smaller than a length of the first contact in the channel length direction.

6. The semiconductor memory device according to claim 1, wherein a distance between the second contact and a gate electrode of the second transistor is the same as a distance between the first contact and a gate electrode of the first transistor.

7. The semiconductor memory device according to claim 1, wherein a channel length direction of the first transistor and a channel length direction of the second transistor is the same, and a length of the second transistor is smaller than a length of the first transistor in the channel length direction.

8. A semiconductor memory device comprising:
   a memory cell array defined in a memory structure stacked on a logic structure; and
   a page buffer, defined in the logic structure, that includes a sensing circuit that reads data stored in the memory cell array,
   the page buffer comprising:
   a first transistor included in the sensing circuit; and a second transistor not included in the sensing circuit,
wherein a cross-sectional dimension of a first contact coupled to the first transistor and a cross-sectional dimension of a second contact coupled to the second transistor are different from each other.

9. The semiconductor memory device according to claim 8, wherein the cross-sectional dimension of the second contact is smaller than the cross-sectional dimension of the first contact.

10. The semiconductor memory device according to claim 8, wherein the first contact is coupled to a junction region of the first transistor, and the second contact is coupled to a junction region of the second transistor.

11. The semiconductor memory device according to claim 8, wherein the first and second transistors are disposed on a single substrate, and the first and second contacts pass through a dielectric layer that isolates the substrate and a wiring layer over the substrate and that covers the first and second transistors.

12. The semiconductor memory device according to claim 8, wherein a channel length direction of the first transistor and a channel length direction of the second transistor is the same, and a length of the second contact is smaller than a length of the first contact in the channel length direction.

13. The semiconductor memory device according to claim 8, wherein a distance between the second contact and a gate electrode of the second transistor is the same as a distance between the first contact and a gate electrode of the first transistor.

14. The semiconductor memory device according to claim 8, wherein a channel length direction of the first transistor and a channel length direction of the second transistor is the same, and a length of the second transistor is smaller than a length of the first transistor in the channel length direction.

15. A semiconductor memory device comprising:
a memory cell array defined in a cell wafer; and
a page buffer, defined in a peripheral wafer bonded onto the cell wafer, that includes a sensing circuit that reads data stored in the memory cell array,
the page buffer comprising:
a first transistor included in the sensing circuit; and
a second transistor not included in the sensing circuit,
wherein a cross-sectional dimension of a first contact coupled to a junction region of the first transistor and a cross-sectional dimension of a second contact coupled to a junction region of the second transistor are different from each other.

16. The semiconductor memory device according to claim 15, wherein the cross-sectional dimension of the second contact is smaller than the cross-sectional dimension of the first contact.

17. The semiconductor memory device according to claim 15, wherein the first contact is coupled to a junction region of the first transistor, and the second contact is coupled to a junction region of the second transistor.

18. The semiconductor memory device according to claim 15, wherein the first and second transistors are disposed on a single substrate, and the first and second contacts pass through a dielectric layer that isolates the substrate and a wiring layer over the substrate and that covers the first and second transistors.

19. The semiconductor memory device according to claim 15, wherein a channel length direction of the first transistor and a channel length direction of the second transistor is the same, and a length of the second contact is smaller than a length of the first contact in the channel length direction.

20. The semiconductor memory device according to claim 15, wherein a distance between the second contact and a gate electrode of the second transistor is the same as a distance between the first contact and a gate electrode of the first transistor.

* * * * *